United States Patent
Yi et al.

(10) Patent No.: US 8,482,064 B2
(45) Date of Patent: Jul. 9, 2013

(54) TERMINATION FOR SUPERJUNCTION VDMOSFET

(75) Inventors: Yangbo Yi, Suzhou (CN); Haisong Li, Suzhou (CN); Qin Wang, Suzhou (CN); Ping Tao, Suzhou (CN); Lixin Zhang, Suzhou (CN)

(73) Assignee: Suzhou Poweron IC Design Co., Ltd., Dushu Lake, Suzhou Industrial Park, Jiangsu Province (CN)

( * ) Notice: Subject to any disclaimer, the term of this patent is extended or adjusted under 35 U.S.C. 154(b) by 0 days.

(21) Appl. No.: 13/493,505

(22) Filed: Jun. 11, 2012

(65) Prior Publication Data
US 2013/0069155 A1    Mar. 21, 2013

(30) Foreign Application Priority Data
Sep. 21, 2011   (CN) .......................... 2011 1 0281585

(51) Int. Cl.
*H01L 29/78*   (2006.01)

(52) U.S. Cl.
USPC ..... 257/335; 257/327; 257/342; 257/E29.257

(58) Field of Classification Search
USPC ................................................ 257/327–342
See application file for complete search history.

(56) References Cited

U.S. PATENT DOCUMENTS

| | | | |
|---|---|---|---|
| 7,655,981 B2* | 2/2010 | Lee et al. | 257/339 |
| 7,989,910 B2* | 8/2011 | Saito et al. | 257/493 |
| 2012/0276701 A1* | 11/2012 | Yedinak et al. | 438/270 |

* cited by examiner

*Primary Examiner* — Mamadou Diallo
(74) *Attorney, Agent, or Firm* — Colin P. Cahoon; Celina M. Orr; Carstens & Cahoon, LLP

(57) ABSTRACT

A termination for silicon superjunction VDMOSFET comprises heavily doped N-type silicon substrate which also works as drain region; drain metal is disposed on the back surface of the heavily doped N-type silicon substrate; an N-type silicon epitaxial layer is disposed on the heavily doped N-type silicon substrate; P-type silicon columns and N-type silicon columns are formed in the N-type silicon epitaxial layer, alternately arranged; a continuous silicon oxide layer is disposed on a part of silicon surface in the termination; structures that block the drift of mobile ions (several discontinuous silicon oxide layers arranged at intervals) are disposed on the other part of silicon surface in the termination. The structures that block the drift of mobile ions disposed in the termination region are able to effectively prevent movement of the mobile ions and improve the capability of the power device against the contamination induced by the mobile ions.

1 Claim, 3 Drawing Sheets ated with the development of power VDMOSFET technology.
TERMINATION FOR SUPERJUNCTION VDMOSFET

TECHNICAL FIELD

The present invention relates to a termination for silicon superjunction VDMOSFET (namely superjunction vertical double-diffused Metal-Oxide-Semiconductor field effect transistor), and more particularly, to a termination for silicon superjunction VDMOSFET which is highly reliable under high temperature reverse bias. The present invention belongs to the technical field of semiconductor power device.

BACKGROUND OF THE INVENTION

At present, the application of power devices is becoming more and more widespread in fields of daily life, production, and so on. Especially, the power VDMOSFET has relatively fast switching speed, relatively small driving current, and relatively wide area of safe operation, thus it is appreciated by many researchers. Currently, power devices are developed to have increased operating voltage, increased operating current, reduced on-resistance and to become integrated. The contrivance of superjunction is an important milestone in the development of power VDMOSFET technology.

Power devices are not only popular in sophisticated technology fields of national defense, aerospace, aviation, etc., but are also appreciated in fields of industries, household appliances and so on. Along with the development of power devices, the reliability has become the main concern for people. Power devices provide required forms of electric power for electronic devices and provide driving energy for electrical machinery, they are applied in almost all electronic devices and electrical machinery, therefore, the study on reliability of power devices has great importance. Reliability is defined as the capability of a given device that will perform required functions under required conditions for a specific period of time. Required conditions typically refer to operating conditions and environment conditions; operating conditions refer to the conditions of stress that will have effects on the products or materials, such as electric stress, chemical stress and physics stress. As a consequence of the operating conditions, power devices are subjected to High power dissipation and intensive self-heating, so we should pay great attention to the reliability under high temperature and high pressure. High temperature reverse bias (HTRB) testis exactly a kind of test for evaluating the lifetime and reliability of power device chips under high temperature reverse bias. Under the specific conditions, the mobile ions (mainly are Sodium ions) introduced by package have certain chances to pass through the passivation layer and dielectric layer of the power device chips and enter the interface between silicon and silicon dioxide, and these mobile ions will change the electric field distribution on the silicon surface of the power device and degrade the withstand voltage of the power device. Therefore, it is of important significance to design a power device that can withstand HTRB test conditions.

SUMMARY OF THE INVENTION

The object of the present invention is achieved by the following technical scheme: a termination for silicon superjunction VDMOSFET comprises heavily doped N-type silicon substrate which also works as drain region, drain metal is disposed on a back surface of the heavily doped N-type silicon substrate, an N-type silicon epitaxial layer is disposed on the heavily doped N-type silicon substrate, P-type silicon columns and N-type silicon columns are formed in the N-type silicon epitaxial layer, the P-type silicon columns and the N-type silicon columns are alternately arranged; a continuous silicon oxide layer is disposed on a part of silicon surface of the termination, structures that block the drift of mobile ions are disposed on the other part of silicon surface of the termination, the structures that block the drift of mobile ions are several discontinuous silicon oxide layers arranged at intervals.

Preferably, the discontinuous silicon oxide layers are arranged such that the discontinuous silicon oxide layers are placed at intervals and parallel to each other, each of the discontinuous silicon oxide layers passes across the surfaces of all the P-type silicon columns and N-type silicon columns alternately arranged.

The present invention has prominent substantive features and represents notable progresses as follows:

According to the present invention, the structures that block the drift of mobile ions disposed on the surface of the termination is able to restrain mobile ions from moving to central region of chip from termination region of the superjunction VDMOS. At high drain voltages, there will be a crowding of the potential contours nearby the discontinuous silicon oxide layers, which means the electric field is higher than that in other regions. It is referred to as local peak electric field. When the mobile ions drift near the discontinuous silicon oxide layers, they will be stabled there due to the effect of the peak electric field. Therefore, the structure disposed on the surface of the termination of the superjunction VDMOS is capable of preventing the drift of the mobile ions, so as to improve the capability of the power device against the contamination induced by the mobile ions.

BRIEF DESCRIPTION OF THE DRAWINGS

The present invention will be described in more details with reference to the accompanying Figures.

DETAILED DESCRIPTION OF THE PREFERRED EMBODIMENTS

Figure 1:
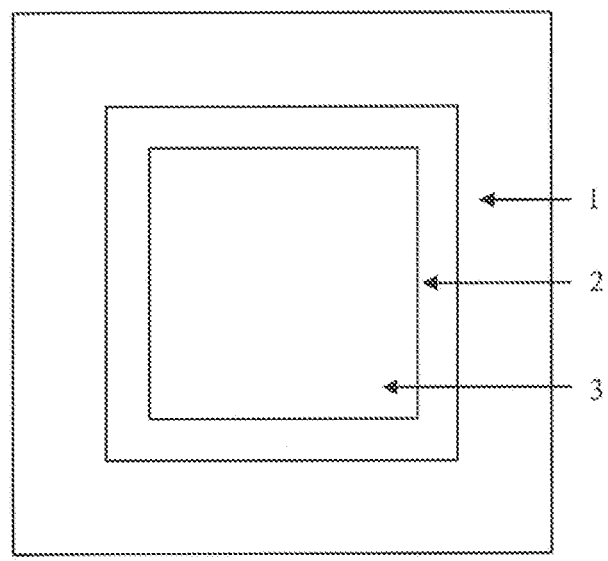
FIG. 1 is a schematic diagram illustrating the position of the termination for superjunction VDMOSFET in the chip.

As shown in FIG. 1, a termination 1 for superjunction VDMOSFET (vertical double-diffused Metal-Oxide-Semiconductor field effect transistor) is disposed around transition region 2, and the transition region 2 surrounds primitive cells region 3.

Figure 2:
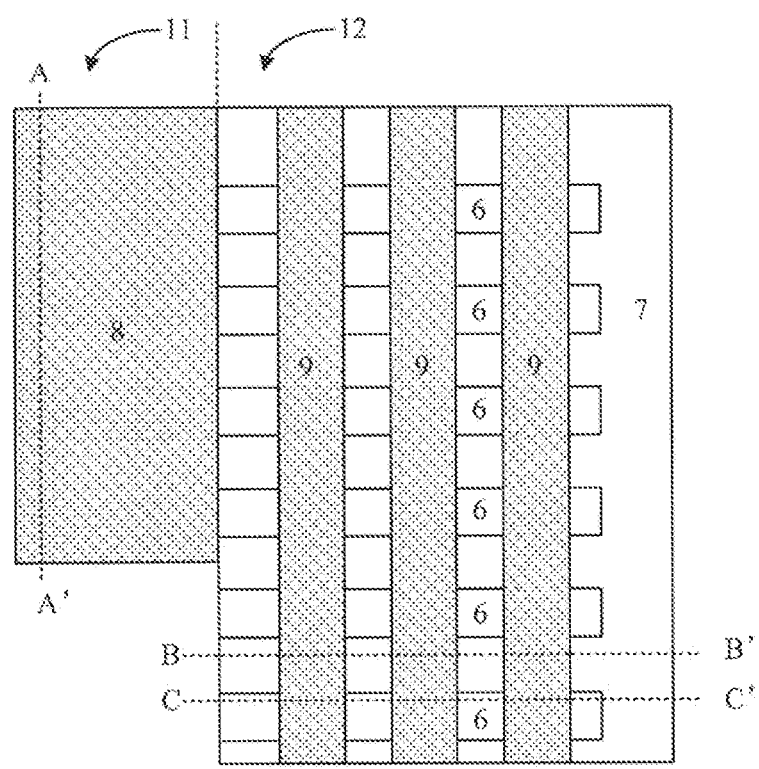
FIG. 2 is a top view illustrating the termination for superjunction VDMOSFET of the present invention.
Figure 3:
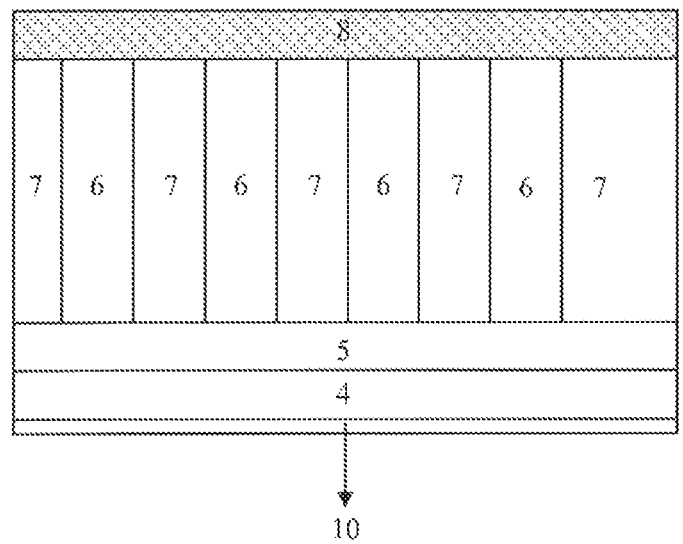
FIG. 3 is a sectional view illustrating the termination for superjunction VDMOSFET cut along A-A' line in FIG. 2.
Figure 4:
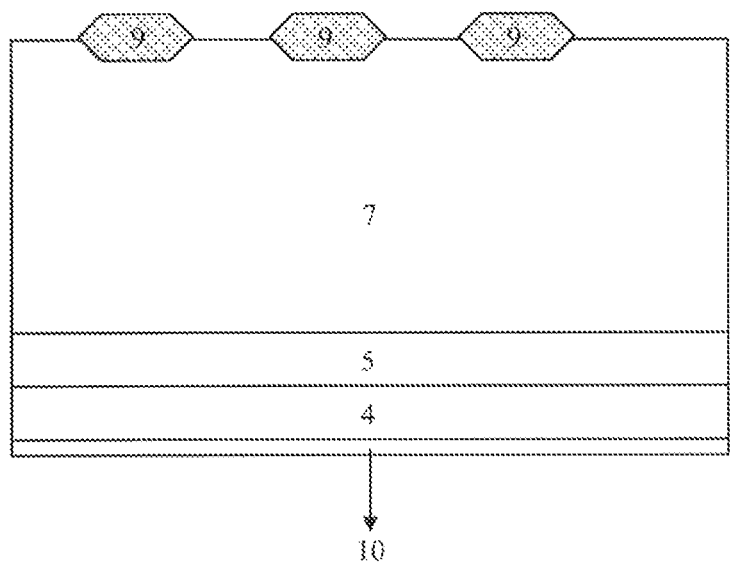
FIG. 4 is a sectional view illustrating the termination for superjunction VDMOSFET cut along B-B' line in FIG. 2.
Figure 5:
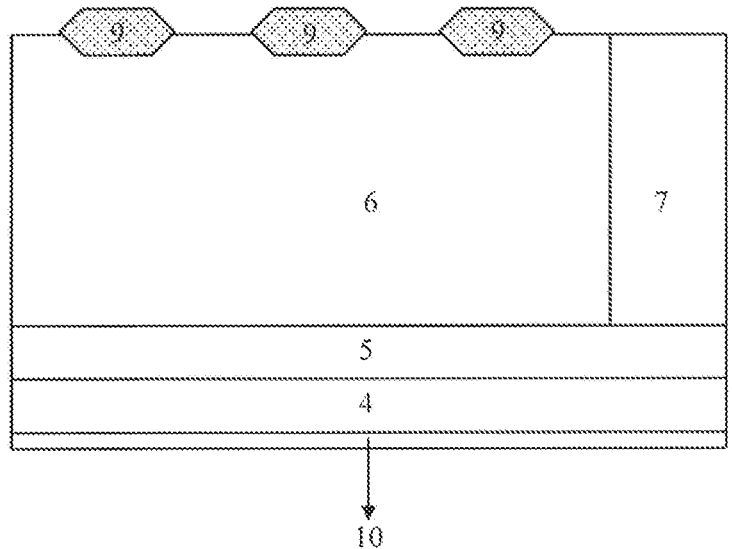
FIG. 5 is a sectional view illustrating the termination for superjunction VDMOSFET cut along C-C' line in FIG. 2.

FIG. 2 is a top view illustrating a part of the termination. FIG. 3 is a sectional view of the termination cut along A-A' line in FIG. 2, FIG. 4 is a sectional view of the termination cut along B-B' line in FIG. 2, and FIG. 5 is a sectional view of the termination cut along C-C' line in FIG. 2. As shown in FIGS. 2-5, the termination for the superjunction VDMOSFET comprises heavily doped N-type silicon substrate 4, which also works as drain region. Drain metal 10 is disposed on a back surface of the heavily doped N-type silicon substrate 4. An N-type silicon epitaxial layer 5 is disposed on the heavily doped N-type silicon substrate 4. P-type silicon columns 6 and N-type silicon columns 7 are formed in the N-type silicon epitaxial layer 5. The P-type silicon columns 6 and the N-type silicon columns 7 are arranged alternately. A continuous silicon oxide layer 8 is disposed on a first silicon surface region 11 of the termination 1. Structures that block the drift of mobile ions are disposed on a second silicon surface region 12 of the termination 1. The structures that block the drift of mobile ions are discontinuous silicon oxide layers 9. There exists peak electric field at interfaces between the discontinuous silicon oxide layers 9 and the silicon, so the mobile ions moving to the interfaces between the discontinuous silicon oxide layers 9 and the silicon cannot continue moving under the influence of the peak electric field. The discontinuous silicon oxide layers 9 are arranged such that the discontinuous silicon oxide layers are placed at intervals and parallel to each other; each silicon dioxide layer passes across surfaces of all of the P-type silicon columns 6 and the N-type silicon columns 7 which are alternately arranged.

Figure 6:
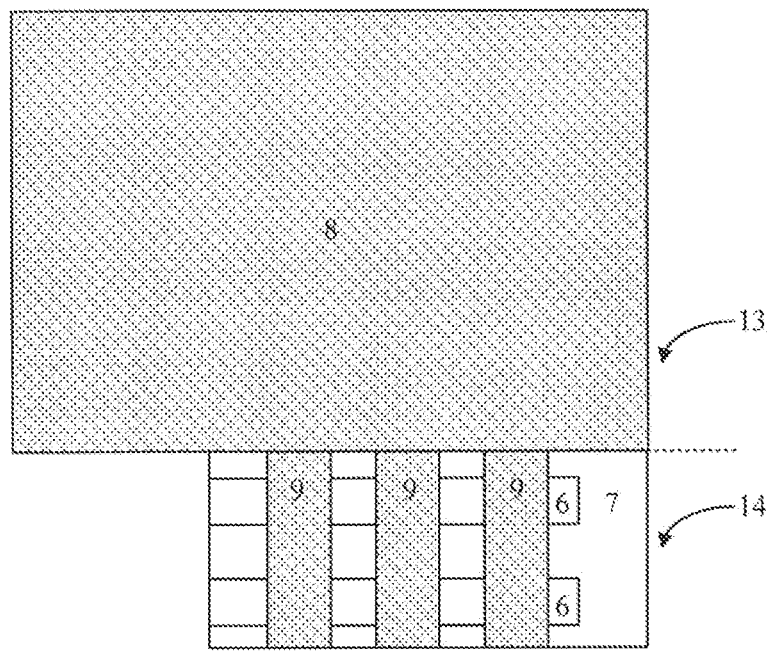
FIG. 6 is a top view illustrating a modified structure of the termination for superjunction VDMOSFET as shown in FIG. 2.

As shown in FIG. 6, a modified structure according to the embodiment above is as follows: the continuous silicon oxide layer 8 is disposed on a third silicon surface region 13 of the termination 1. The discontinuous silicon oxide layers 9 are disposed on a fourth silicon surface region 14 of the termination 1. The discontinuous silicon oxide layers 9 are arranged such that the discontinuous silicon oxide layers are placed at intervals and parallel to each other; each discontinuous silicon dioxide layer 9 passes across the surfaces of part of but not all of the P-type silicon columns 6 and the N-type silicon columns 7 which are arranged alternately.

As stated above, the structures that block the drift of mobile ions disposed on the surface of the termination are able to restrain mobile ions from moving to central region of chip from termination region of the superjunction VDMOS. At high drain voltages, there will be a crowding of the potential contours nearby the discontinuous silicon oxide layers, which means the electric field is higher than that in other regions. It is referred to as local peak electric field. When the mobile ions drift near the discontinuous silicon oxide layers, they will be stabled there due to the effect of the peak electric field. Therefore, the structure disposed on the surface of the termination of the superjunction VDMOS is capable of preventing the drift of the mobile ions, so as to improve the capability of the power device against the contamination induced by the mobile ions.

The preferred embodiments described above are not restricted. It will be understood by those skilled in the art that various modifications, identical replacements and improvements may be made therein without departing from the principle and the scope of the invention.

What is claimed is:

1. A termination for superjunction VDMOSFET (vertical double-diffused Metal-Oxide-Semiconductor field effect transistor), wherein: the termination comprises heavily doped N-type silicon substrate (4) which also works as drain region; drain metal (10) is disposed on a back surface of the heavily doped N-type silicon substrate (4); an N-type silicon epitaxial layer (5) is disposed on the heavily doped N-type silicon substrate (4); P-type silicon columns (6) and N-type silicon columns (7) are formed in the N-type silicon epitaxial layer (5); the P-type silicon columns (6) and the N-type silicon columns (7) are alternately arranged; a continuous silicon oxide layer (8) is disposed on a part of silicon surface of the termination; structures that block the drift of mobile ions are disposed on the other part of silicon surface of the termination; and the structures that block the drift of mobile ions are several discontinuous silicon oxide layers (9) arranged at intervals; the discontinuous silicon oxide layers (9) are arranged such that the discontinuous silicon oxide layers (9) are placed at intervals and parallel to each other; and each of the discontinuous silicon oxide layers passes across the surfaces of all the P-type silicon columns (6) and N-type silicon columns (7) alternately arranged.

* * * * *